United States Patent [19]

Endo et al.

[11] 4,069,759

[45] Jan. 24, 1978

[54] LIGHT AND HEAT FORMATION OF CONDUCTIVE IMAGE PRINTING PLATE

[75] Inventors: Ichiro Endo, Yokohama; Hajime Kobayashi, Mitaka, both of Japan; Kikuo Kinjo, deceased, late of Tokyo, Japan, by Ayako Kinjo, legal representative

[73] Assignee: Canon Kabushiki Kaisha, Japan

[21] Appl. No.: 599,061

[22] Filed: July 25, 1975

[30] Foreign Application Priority Data

July 27, 1974 Japan .................................. 49-86384
Aug. 16, 1974 Japan .................................. 49-94366

[51] Int. Cl.² ...................... G03C 1/42; G03G 5/026; G03G 5/028
[52] U.S. Cl. .................................. 101/467; 96/1 R; 96/114.1; 101/DIG. 13
[58] Field of Search ...................... 101/DIG. 13, 467; 96/1 R, 114.1

[56] References Cited

U.S. PATENT DOCUMENTS

| | | | |
|---|---|---|---|
| 2,972,304 | 2/1961 | Jarvis | 101/DIG. 13 |
| 2,990,280 | 6/1961 | Giaimo | 101/DIG. 13 |
| 3,033,765 | 5/1962 | King et al. | 96/1.5 X |
| 3,057,788 | 10/1962 | Reithel | 101/DIG. 13 |
| 3,106,518 | 10/1963 | Reithel | 101/DIG. 13 |
| 3,132,963 | 5/1964 | Jarvis | 101/DIG. 13 |
| 3,210,185 | 10/1965 | Olden | 101/DIG. 13 |
| 3,227,633 | 1/1966 | Tokumoto et al. | 101/DIG. 13 |
| 3,245,833 | 4/1966 | Trevoy | 101/DIG. 13 |
| 3,326,709 | 6/1967 | Nail | 101/DIG. 13 |
| 3,368,894 | 2/1968 | Matkan et al. | 101/DIG. 13 |
| 3,457,075 | 7/1969 | Morgan et al. | 96/67 |
| 3,531,286 | 9/1970 | Renfrew | 96/67 |
| 3,589,903 | 6/1971 | Birkeland | 96/67 |
| 3,764,329 | 10/1973 | Lee | 96/67 |

FOREIGN PATENT DOCUMENTS 188,030    10/1922    United Kingdom ........ 101/DIG. 13

*Primary Examiner*—Clyde I. Coughenour
*Attorney, Agent, or Firm*—Fitzpatrick, Cella, Harper & Scinto

[57] ABSTRACT

A master for electrostatic printing comprises a layer composed of conductive silver image portion containing metallic silver grains and a non-silver image portion having an electric resistance sufficient to retain electrostatic charge. The image formed by image light exposure and heating a layer including an organic silver salt compound, a reducing agent and an insulating medium.

35 Claims, 11 Drawing Figures

4,069,759

LIGHT AND HEAT FORMATION OF CONDUCTIVE IMAGE PRINTING PLATE

BACKGROUND OF THE INVENTION

1. Field of the Invention

This invention relates to a master for electrostatic printing and a process for electrostatic printing, and more particularly, it relates to a master for electrostatic printing of high sensitivity, high durability, and panchromatic response.

2. Description of the Prior Art

Heretofore, there are known many printing methods. Among them, electrostatic printing methods belong to a special printing field. The principle of conventional printing techniques is based on selectively adhering ink to the surface of a printing master surface in accordance with the uneven surface on the printing master or a difference of solvent affinity, and then pressing the attached ink to a paper. On the contrary, in electrostatic printing the ink is not mechanically attached to a printing master, but the ink (toner) is electrostatically attached to a printing master and then transferred to a paper.

As to printing characteristics, according to usual printing methods, the ink is attached to the printing master at a relatively stable state so that many sheets of paper can be printed at high speed, but the ink disadvantageously attaches to portions other than those to be printed. On the contrary, in electrostatic printing methods the toner attaches to a master electrostatically so that the attaching state is not sufficiently stable for conventional high speed printing usually carried out under severe conditions. Problems such as dirtying as mentioned above do not occur in electrostatic printing methods. In view of the disadvantages, electrostatic printing has not been practically used where clean printing is needed. In other words, electrostatic printing is poorer than conventional printing methods for providing many sheets of print and clear print. For example, representative conventional electrostatic printing masters are a master composed of a conductive support and an insulating image overlying the conductive support and a master composed of an insulating support and a conductive image overlying on the insulating support. The image may be produced by attaching an insulating or a conductive lacquer in a form of the image pattern to the support, or by coating a photosensitive lacquer on a support, imagewise exposing and selectively removing the exposed or unexposed portions by etching. The electrostatic printing masters having such a structure as above have various drawbacks in points of sharpness of the print and durability of the electrostatic printing master when used in a most conventional electrostatic printing process. Such a process involves sequential recycling of a charging step for forming electrostatic images by selectively retaining electric charge at image portions in case of the image portions being insulating; a developing step involving conducting the development with toners charged with a polarity opposite to that of image portions; and a transferring step for transferring the toner images to a transfer paper. For example, one drawback of the conventional electrostatic printing master has an uneven surface on which images are formed and therefore, the uneven surface is damaged by mechanical abrasion during the printing process causing irregular charging so that durability of the master is very low. Further since it is very difficult to obtain a high resolving power from such an uneven surface type master, it is also difficult technically to obtain a print having high resolution. Furthermore, it is difficult to obtain images of half tone or gradation by such an uneven surface type of master.

SUMMARY OF THE INVENTION

According to the present invention, there is provided an electrostatic printing master which comprises a layer composed of a silver image portion containing metallic silver grains and a non-silver image portion having an electric resistance sufficient to retain electrostatic charge.

According to another aspect of the present invention, there is provided a photosensitive member which comprises a base having at least one electrically conductive area on the surface and a photosensitive layer overlying at least the electrically conductive area said photosensitive layer comprising an organic silver salt compound, a small amount of a halide as compared with the organic silver salt compound, and an insulating medium.

According to a further aspect of the present invention, there is provided a process for electrostatic printing which comprises at least a development step and a transfer step, and said development step comprising developing an electrostatic latent image on a surface of a master for electrostatic printing said master comprising a layer composed of a silver image portion containing metallic silver grains and a non-silver image portion having an electric resistance sufficient to retain electrostatic charge.

An object of the present invention is to provide an electrostatic printing master having a novel structure solving drawbacks of conventional electrostatic printing masters.

Another object of the present invention is to provide a panchromatic electrostatic printing master of high sensitivity and high resolving power.

A further object of the present invention is to provide an electrostatic printing master having a layer composed of a silver image portion containing fine metallic silver particles and a non-silver image portion having an electric resistance sufficient to retain electrostatic charge.

A still another object of the present invention is to provide a process for electrostatic printing by using the above mentioned electrostatic printing master.

A still further object of the present invention is to provide a process for electrostatic printing of high sensitivity and panchromatism.

A still another object of the present invention is to provide a process for electrostatic printing which comprises at least a developing step and a transferring step, said developing step being carried out by developing electrostatic latent images formed on the surface of an electrostatic printing master having a layer composed of a silver image portion containing fine metallic silver particles and a non-silver image portion having an electric resistance sufficient to retain electrostatic charge.

BRIEF DESCRIPTION OF THE DRAWING

FIG. 4, FIG. 5, FIG. 6 and FIG. 7 show a charging step, a developing step, a transferring step and a cleaning step, respectively;

– FIG. 7 is carried out.

DESCRIPTION OF THE PREFERRED EMBODIMENTS

The desirable characteristics of the electrostatic printing master of the present invention are attributable to the fact that the silver image forming the image is carried in an insulating medium and high resolution and continuous gradation of the silver image itself. In the present invention, the silver image is carried in the insulating medium and therefore the image of the master is not formed by unevenness of the master surface so that the image is hardly damaged by mechanical abrasion and the master has excellent durability. The silver image is made of an aggregation of fine metallic silver particles and the resolving power is at the fine particle level so that the resolution is very excellent. Further, when silver images are employed, the density can be changed according to optional continuous gradation by the concentration of fine grains of metallic silver and images of continuous gradation can be easily regenerated.

The electrostatic printing master of the present invention may be formed by photographically exposing a silver salt photosensitive member and therefore, the sensitivity and panchromatism are far better than those of conventional electrostatic printing masters. Further, the fidelity to the original is far better than that of conventional ones and the master can be produced within a short time.

Consequently, the electrostatic printing method according to the present invention can give several thousand clear and sharp copies within a short time, that is, high speed multiple copying is possible.

Figure 1:
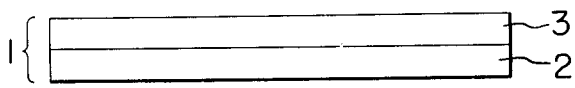
FIG. 1 shows an embodiment of a photosensitive member used for forming an electrostatic printing master according to the present invention.

The electrostatic printing master of the present invention may be readily produced from a silver salt photosensitive member. FIG. 1 is one of the representative silver salt photosensitive members. The silver salt photosensitive member 1 in FIG. 1 is composed of a silver salt photosensitive layer 3 and a base 2. Silver salt photosensitive layer 3 is mainly composed of a silver salt compound capable of forming isolated silver and an insulating medium.

Representative silver salt photosensitive layers are emulsion layers of silver halide emulsion for photography, Lippmann emulsion for high resolution, emulsion for high resolution dry plate, silver salt emulsion for plate making (for example, direct positive emulsion) and the like. These emulsion layers are well known photosensitive materials, and can form silver images by wet developing after exposure.

Formation of silver images by a dry process is usually so simple that it is preferable from practical point of view. An example of photosensitive materials for such dry process is composed of an organic silver salt, a reducing agent and a halogenating agent of which amount is small as compared with that of the organic silver salt, in an insulating medium. When such dry type of photosensitive material is used, silver images can be produced by heat development after imagewise exposure so that a series of procedures from the formation of the electrostatic printing master from an original to the formation of electrostatic image formation can be continuously within a short time. Therefore, such process is one of the preferable embodiments of the present invention.

Representative photosensitive materials for the dry development and treating methods therefor are as shown below.

Representative organic silver salts are such as silver behenate, silver arachidate, silver stearate, silver palmitate, silver myristate, silver laurate, silver caprylate, silver hydroxystearate, silver acetate, silver benzoate, silver 4-n-octadecyloxydiphenyl-4-carboxylate, silver-o-aminobenzoate, silver acetoamidobenzoate, silver furoate, silver camphorate, silver p-phenylbenzoate, silver phenyl acetate, silver salicylate, silver butyrate, silver terephthalate, silver phthalate, silver acid phthalate, silver phthalazinone, silver benzotriazole, silver saccharine and the like.

For the purpose of imparting a photosensitivity to the organic silver salts, a halogenating agent as shown below may be applied to form the silver halide: various inorganic halides such as $NH_4X$, $CrX_2$, $IrX_4$, $InX_4$, $CoX_2$, $CdX_2$, $KX$, $HX$, $SnX_2$, $SnX_4$, $SrX_2$, $SO_2X_2$, $TiX_3$, $TiX_4$, $CuX_2$, $NaX$, $PbX_2$, $NiX_2$, $PdX_2$, $MgX_2$, $AlX_3$, $ZnX_2$, $MnX_2$, $BaX_2$, $KAuX_4$, $HAuX_4$, $BiX_3$, $CsX$, $FeX_3$, $AgX$, $HgX_2$, $CaX_2$ and the like where X is chloro, bromo or iodo.

The amount of the halogenating agent may be optionally selected depending upon each purpose. It is preferably less than $10^{-1}$ part by weight per one part by weight of the organic silver salt, more preferably from $10^{-5}$ to $10^{-1}$ part by weight.

If desired, dye sensitizers, toning agents, stabilizers and other additives may be incorporated.

The developing procedure may be conducted by preliminarily incorporating a reducing agent such as substituted phenols, substituted naphthols and the like to the photosensitive layer as, for example, by coating it on the surface of the photosensitive layer and heat-developing.

Representative reducing agents are: hydroquinone, methyl hydroquinone, chlorohydroquinone, bromohydroquinone, catechol, pyrogallol, methylhydroxynaphthalene, aminophenol, 2,2'-methylene-bis-(6-t-butyl-4-methylphenol), 4,4'-butylidene-bis-(6-t-butyl-3-methylphenol), 4,4'-bis-(6-t-butyl-3-methylphenol), 4,4'-thio-bis-(6-t-2-methylphenol), octadecyl-3-(3',5'-di-t-butyl-4'-hydroxyphenyl) propionate, 2,6-di-t-butyl-p-cresol, 2,2'-methylene-bis (4-ethyl-6-t-butylphenol), phenidone, metol, 2,2'-dihydroxy-1,1'-binaphthyl, 6,6'-dibromo-2,2'-dihydroxy-1,1'-binaphthyl, 6,6'-dinitro-2,2'-dihydroxy-1,1'-binaphthyl, bis-(2-hydroxy-1-naphthyl) methane and mixtures thereof.

For example, these reducing agents may be mixed with a resin such as cellulose acetate by using an optional solvent and applied to a surface of the photosensitive layer.

It is also possible to carry out a developing procedure without incorporating a developing agent (a reducing agent) to the photosensitive layer, that is, it is possible to effect an external type of wet developing procedure. For example, a developing solution containing a reducing agent as mentioned above is applied to a buffer solution adjusted to a low pH. Fixing may be effected with a usual solution of sodium thiosulfate.

As the solvents for dispersing the organic silver salt in an insulating medium, there may be mentioned methylene chloride, chloroform, dichloroethane, 1,1,2-trichloroethane, trichloroethylene, tetrachloroethane, carbon tetrachloride, 1,2-dichloropropane, 1,1,1-trichloroethane, tetrachloroethylene, ethyl acetate, butyl acetate, isoamyl acetate, cellosolve acetate, toluene, xylene, acetone, methyl ethyl ketone, dioxane, tetrahydrofuran, dimethylamide, N-methylpyrrolidone, alcohols such as methyl alcohol, ethyl, alcohol, isopropyl alcohol, butyl alcohol and the like, and water.

As the insulating medium, there may be mentioned polystyrene resin, polyvinyl chloride resin, phenolic resin, polyvinyl acetate resin, polyvinyl acetal resin, epoxy resin, xylene resin, alkyd resin, polycarbonate resin, poly (methylmethacrylate) resin, polyvinyl butyral resin, gelatine resin, polyester, polyurethane, acetyl cellulose, synthetic rubber, polybutene, and the like.

If desired, there may be added a plasticizer. As the plasticizer, there may be mentioned dioctyl phthalate, tricresyl phosphate, diphenyl chloride, methyl naphthalene, p-terphenyl, diphenyl and the like.

The amount of the insulating medium upon forming the photosensitive layer is usually 0.02 – 20 parts by weight per one part by weight of the organic silver salt compound.

As the photosensitive material for preparing the electrostatic printing master, there may be used conventional materials as shown below.

For example, there can be used a photosensitive material for forming silver images by diffusion transferring. The negative material having a gelatine layer containing a silver halide is exposed, soaked in a solvent capable of dissolving silver halide and contacted with a positive material having a gelatine layer containing colloid silver in the solvent. The silver halide corresponding to the unexposed portion of the negative material is dissolved in the solvent and diffused into the gelatine layer of the positive material and is reduced at the colloid silver of the positive material as a developing nucleus to separate silver and form positive silver images.

Another method is known as auto positive. The photosensitive material having a gelatine layer containing a silver halide is subjected to a blanket exposure and then an imagewise exposure. As the result, the imagewise exposed portion loses its ability for reducing and separating silver in the subsequent developing treatment, according to the Herschel effect, and silver separates at a portion other than the imagewise exposed portion to form silver images.

A further photosensitive material is that which has a vapor deposited silver halide layer, and silver images can be obtained by treating the silver halide layer in a conventional manner, i.e. exposure-development-fixing.

Still another photosensitive material is that known as photosolubilization, that is, fixing a gelatine layer containing a silver halide with mercaptans or thioureas, exposing, developing and washing with water to form silver images.

When a photosensitive member is produced by using the above mentioned photosensitive material as a photosensitive layer, usually a base is coated with the photosensitive material and in general, the coating procedure may be a conventional one often used for forming a thin film of synthetic resins. For example, there may be mentioned a rotary coating of an emulsion solution, a wire-bar coating, a flow-coating, and air-knife coating, and the film thickness can be adjusted accordingly.

The base may be a metal plate such as aluminum, copper, zinc, silver and the like, a metal laminate paper, a paper treated to prevent permeation of a solvent, a paper treated with a conductive polymer, a synthetic resin film containing a surface active agent, a glass paper, synthetic resin, film and the like having on the surface a vapor-deposited metal, metal oxide or metal halide. Further, there may be used an insulating glass, paper, synthetic resin, and the like. In particular, a flexible metal sheet, paper or other conductive materials which can be wound on a drum are preferable.

When a conductive base is used, it is usually necessary that the specific resistance is lower than that of a non-silver image area of the photosensitive layer in which silver images have been formed, and the specific resistance is preferably less than $10^9$ ohm·cm. and more preferably less than $10^5$ ohm·cm.

Figure 2:
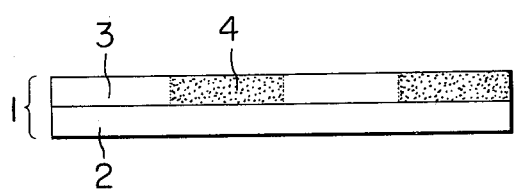
FIG. 2 shows a photosensitive member in which latent images are formed.
Figure 3:
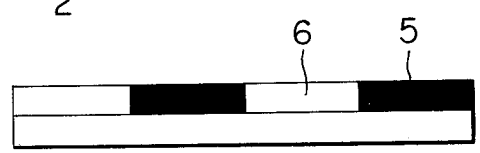
FIG. 3 shows an embodiment of an electrostatic printing master according to the present invention.

For the purpose of preparing a master for electrostatic printing, the photosensitive member 1 having the photosensitive layer 3 formed from various photosensitive materials capable of forming a silver image is subjected to imagewise exposure to form a latent image 4 on the exposed portion as shown in FIG. 2, and then the developing treatment is carried out to form a silver image on the exposed portion 5 (silver image portion) as shown in FIG. 3. No silver image is formed on the unexposed portion 6 (non-silver image portion).

The electric resistance of the non-silver image portion 6 is determined so that it can retain sufficiently electrostatic charges to a practical extent. The specific resistance $\rho_1$ of the silver image portion 5 is determined so that sufficient electrostatic contrast can be formed between the silver image portion and the non-silver image portion, to prevent problems. The specific resistance $\rho_1$ may be usually less than $10^{13}$ ohm·cm, more preferably less than $10^{10}$ ohm·cm.

On the other hand, the specific resistance $\rho_2$ of the non-silver image portion 6 may be usually more than $10^{11}$ ohm·cm., more preferably more than $10^{14}$ ohm·cm.

In particular, for the purpose of forming a sufficiently practical electrostatic contrast, it is preferable to determine the value of the specific resistance $\rho_1$ so as to be less than that of the specific resistance $\rho_2$ by two powers of ten or more.

The thickness of the layer having the silver image portion and non-silver image portion, that is, the layer bearing the silver image may be optionally determined in view of the purpose, use and durability, and it may be usually in the range of from 1 micron to 50 microns, more preferably from 2 microns to 30 microns.

The most fundamental electrostatic printing process using a master for electrostatic printing according to the present invention comprises charging the master to form an electrostatic latent image thereon, developing the latent image and transferring the developed image to a transfer material. However, when the electrostatic latent image was already formed on the surface of the master, the charging step may be omitted, and alternatively when charging transfer method is adopted in the transferring step, the above-mentioned charging step should be conducted only in the first cycle, but in the subsequent recycle process, it may be omitted.

Further, when the electrostatic printing master is prepared from a heat developable photosensitive member, the steps for such purpose, that is, the imagewise exposing and heat developing steps can be incorporated into the electrostatic printing process as the preparative step, and therefore, it becomes possible to attain a continuous process. If necessary, other additional steps, for example, cleaning and fixing steps, may be incorporated into the electrostatic printing process at the time of putting the fundamental process in practice. In addition, as stated below, the fundamental process may be carried out in various embodiments.

Figure 4:
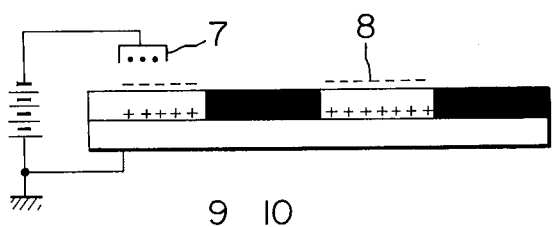
FIG. 4 – FIG. 7 show an embodiment of a series of electrostatic printing steps using an electrostatic printing master according to the present invention.
Figure 5:
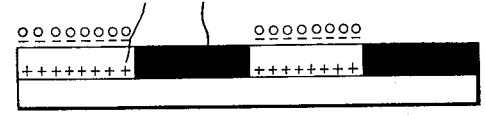
Figure 6:
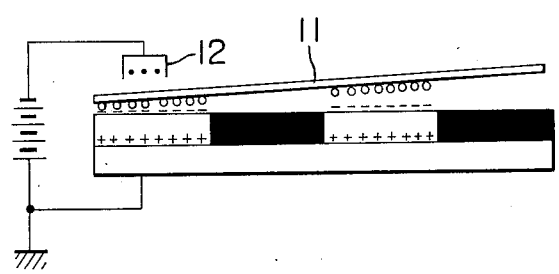
Figure 7:
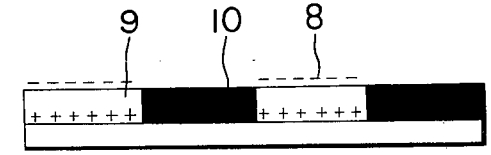

The most fundamental electrostatic printing process is illustrated in FIGS. 4 - 7. As shown in FIG. 4, a master bearing a silver image is caused to pass under, for example, a negative corona electrode 7 so that negative charges 8 can be formed on the surface region having no silver image, that is, non-silver image portion of the master. In this case, either a positive corona electrode or an alternating current corona electrode may be used in place of the negative corona electrode, and a contact electrode may be utilized in place of the corona electrode. As the result of the above-mentioned charging, a latent image of the electrostatic charges is selectively formed on the region having no silver image in the master. Such latent image of the electrostatic charges is subjected to a toner treatment in a usual manner, for example, cascade, magnetic brush, liquid, Magne-dry and wetting developments as shown in FIG. 5. If the toner particles are electrically conductive and charges are not particularly imparted thereto, or if they have charges opposite to those of the image of the electrostatic charges, they adhere to a portion 9 to which charges are imparted. On the other hand, if the same charges as those of the image are imparted to the toner particles, the particles adhere to a portion 10 to which charges are not imparted. As shown in FIG. 6, a transfer material 11 is brought into contact with the surface of the toner image and the toner image can be transferred to the transfer material 11 by using, for example, a corona electrode 12 of the opposite polarity to that of the toner from the back side of the transfer material 11. The toner image thus transferred can be fixed by a technique conventionally known in the art. Usually, heating fixation, solvent fixation and the like are employed. In case that liquid development is carried out, it is sufficient to heat merely the toner image. Besides, pressure-fixation method may be adopted. Subsequently, if necessary, the surface of the master may be cleaned by using a cleaning means such as a brush, a fur brush, cloth, a blade and the like to remove the remaining toner image as shown in FIG. 7.

The electrostatic printing process is carried out either by the above-mentioned charging-developing-transferring-cleaning process or by recycle of the developing-transferring-cleaning process in which the durability of the electrostatic latent image is utilized. In this case, the cleaning step may be omitted if desired. In a particular case, it is possible that an image having a sufficiently large amount of the toner is formed on the master in the first process to repeat the transferring of the toner image onto a different transfer material several times or more.

An operation for obtaining an electrophotographic image can be effected by a conventional technique. For example, as the means of imparting electrostatic charges to a master, it is caused to pass under a corona discharging apparatus at +6 KV several times to impart positive charges to the master, in case of which the electric potential reaches 0 - 1,500 V.

The polarity of the corona discharging may be either positive or negative direct current corona, and an alternating current corona may be used, and alternatively an electrode may be directly brought into contact with the master to impart electrostatic charges to the master. The electric potential due to the electrostatic charges is determined so as not to give rise to dielectric breakdown of the master or spark.

Figure 8:
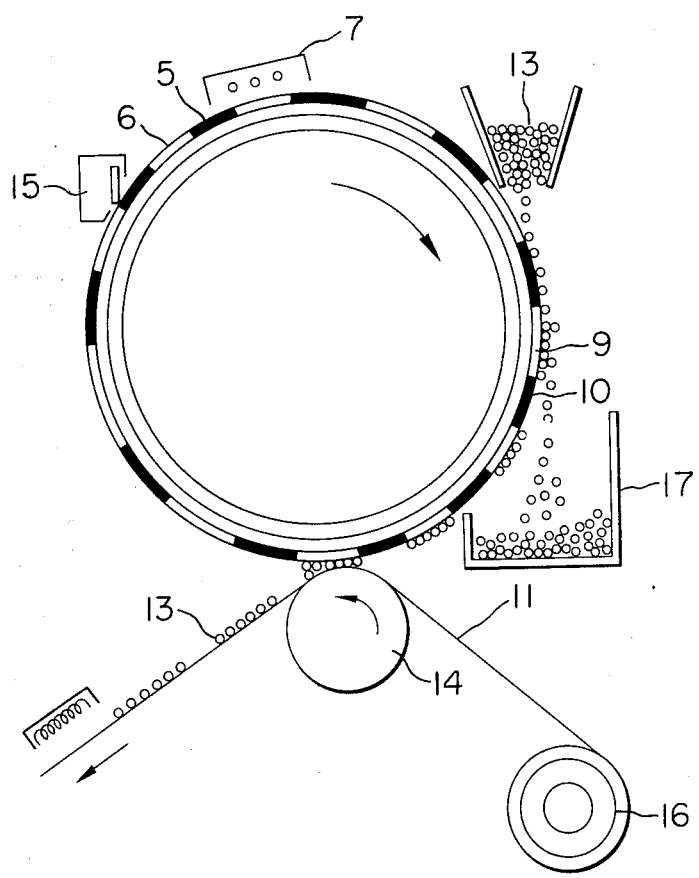
FIG. 8 shows diagrammatically an embodiment of a process by which each step of FIG. 4

For the purpose of recycling the process shown in FIGS. 4 - 7 at a high speed, the process is carried out by rotation of a drum as shown in FIG. 8. The electrostatic printing master having the silver image portion 5 and non-silver image portion 6 is placed, for example, on an electroconductive drum, rotated in the direction of the arrow and charged by means of the corona electrode 7, and subsequently, cascade development is carried out with the toner 13. The toner particles adhere selectively and electrostatically to the non-silver image portion 9 to which electrostatic charges are imparted. The remaining toner particles are collected in a toner receiver 17. The developed toner image is then transferred onto a transfer material 11 fed by a paper-feeding roller 16 by means of a transfer roller 14, in case of which electric field of the opposite polarity to that of the toner charge is applied to the transfer roller 14 if necessary. The transferred toner image is fixed by heat from a heater to give an electrostatic printed matter. The electrostatic printing master is cleaned by a cleaning means 15 (blade cleaning) after the toner image is transferred.

The electrostatic printing process of the present invention is carried out by other processes in addition to the above-mentioned process. As other processes, typical examples thereof are shown in FIGS. 9 - 11.

Figure 9:
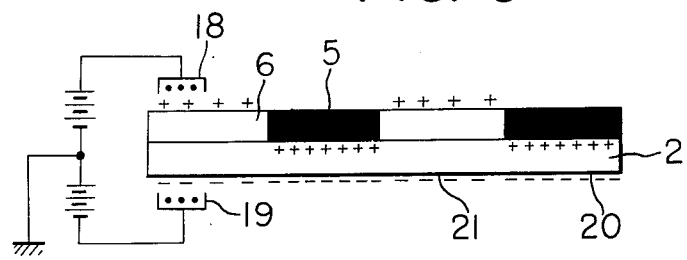
FIG. 9 – FIG. 11 show diagrammatically each embodiment of electrostatic printing process using an electrostatic printing master according to the present invention.

FIG. 9 illustrates an embodiment in which the base 2 of an electrostatic printing master is of insulating property and the electrostatic printing master is subjected to double corona charging by corona electrodes 18 and 19, the polarities of which are selected so as to be opposite to each other. Owing to the charging, in the non-silver image portion 6, electrostatic charges are imparted to both sides of the electrostatic printing master, in case of which the polarity of the charges on one side of the master is opposite to that of the charges on the other side. On the other hand, in the silver image portion 5, the electrostatic charges imparted by the corona electrode 18 reach the interface between the silver image portion 5 and the base 2 through the silver image portion 5 and charged there since the silver image is electrostatically conductive. As the result, the silver image portion retains a large amount of the electrostatic charges through the base as compared with the non-silver image portion depending upon the difference in the electrostatic capacity between the silver image portion and the non-silver image portion which results from the difference in the interval for retaining charges between both portions. Consequently, the electrostatic charges are retained on the base surface 20 corresponding to the silver image portion in a higher charge density while they are retained on the base surface 21 corresponding to the non-silver image portion in a lower charge density so that an electrostatic image is formed. On the other hand, in the upper surface of the electrostatic printing master, the electrostatic charges are retained only on the non-silver image portion 6, thereby forming an electrostatic image. The latter electrostatic image and that formed on the base surface are in relation of positive-negative with respect to the electrostatic contrast. The electrostatic image formed on the upper surface of the electrostatic printing master is developed with the toner having the opposite polarity to that of the electrostatic image to give a positive visible image, whereas it is developed with the toner having the same polarity as that of the electrostatic image to give a negative visible image although the contrast is deteriorated. On the other hand, the electrostatic image formed on the surface of the base is developed with the toner having the opposite polarity to that of the electrostatic image to give a negative visible image, whereas it is developed with the toner having the same polarity as that of the electrostatic image to give a positive visible image although the contrast is decreased. In case of the development with the toner having the same polarity as that of the electrostatic image, the electric potential of the toner is determined so that the electrostatic image to be developed may be sufficiently visualized. Needless to say, as the charging means, those other than the corona electrode may be optionally used as mentioned above.

Figure 10:
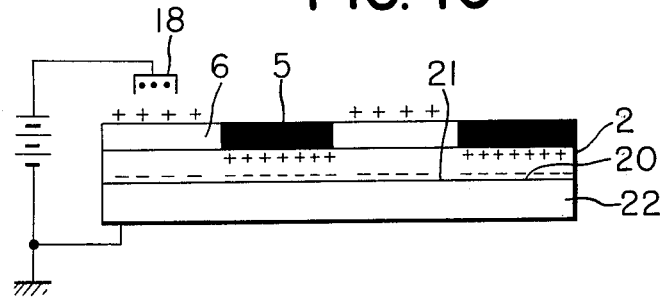

FIG. 10 illustrates one of the examples of other charging means, in which a charging electrode 22 is provided on the surface of the base 20 in place of the corona electrode 19. The charging electrode 22 may be previously formed integrally with the electrostatic printing master or it may formed in another way. Further, it may be in the type of such a drum as shown in FIG. 8. The charging electrode may be removed after the charging.

Figure 11:
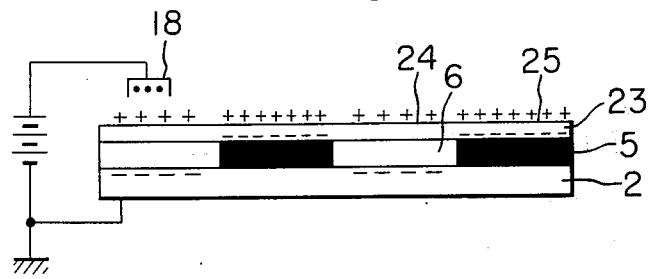

FIG. 11 illustrates other embodiment of the electrostatic printing process of the present invention using an electrostatic printing master having an electro-conductive base 2 and being provided with an insulating layer 23. The electrostatic printing master is charged by means of the corona electrode 18. As the result, the electrostatic charges on the non-silver image portion 6 (unexposed portion) are retained on both the portion 24 of the insulating layer 23 and the interface between the non-silver image portion and the base, whereas the electrostatic charges on the silver image portion 5 (exposed portion) are retained on both the portion 25 of the insulating layer 23 and the interface between the insulating layer and the silver image portion. The non-silver image portion is small in the electrostatic capacity due to the long distance for retaining the electrostatic charges, and therefore the charge density of the non-silver image portion is small. On the other hand, the charge density of the silver image portion is large since its electrostatic capacity is large due to the short distance for retaining the electrostatic charges. As the result, an electrostatic image having a contrast in which a small amount of the electrostatic charges is retained on the non-silver image portion and a large amount thereof is retained on the silver image portion is formed on the surface of the insulating layer 23. The formed electrostatic image is developed with the toner having the opposite polarity to that of the electrostatic charges of the image to give a negative visible image while it is developed with the toner having the same polarity as that of the electrostatic image to give a positive visible image. In case of the development with the toner having the same polarity as that of the image, the electric potential of the toner is determined in order that it may adhere selectively to the non-silver image portion. Needless to say, in the embodiment of FIG. 11, other charging means may be optionally adopted as in the case of FIG. 9. The insulating layer may be previously formed integrally with the electrostatic printing master, or it may be formed in other optional manners. This embodiment is useful and effective in that the insulating layer can function also as a protection layer.

In the embodiments illustrated in FIGS. 9 - 11, the developed visible image, i.e. the toner image is transferred onto the transfer material as shown in FIG. 6, and if necessary, the electrostatic printing master is then subjected to cleaning treatment, and subsequently, the charging-developing-transferring steps are repeated. When the difference in the electrostatic capacity between the non-silver image portion and the silver image portion is utilized to form an electrostatic image as in the embodiments shown in FIGS. 9 - 11, the thickness of the insulating layer and the silver image-bearing layer is determined in order that the contrast of the electrostatic image may be more than a practical level. In addition, a typical structure of the electrostatic printing master used in the present invention is as illustrated in FIG. 3. However, if necessary, the base may be omitted. When the master having no base is applied to the electrostatic printing process, it may be placed on a carrier plate, or in the charging step, the charging may be carried out simultaneously from both sides of the master, for example by applying double corona discharging of the opposite polarity to each other to both side of the master.

As described above, the electrostatic printing process according to the present invention comprises at least a developing step and a transferring step, said developing step comprising developing an electrostatic latent image on the surface of a master for electrostatic printing comprising a layer composed of a silver image portion containing metallic silver grains and a non-silver image portion having an electric resistance sufficient to retain electrostatic charges.

Other excellent advantages of the main function and the structure of the electrostatic printing master according to the present invention are pointed out as follows:

The master is extremely stable chemically and physically since the image on the master is composed of silver, and therefore it is particularly superior in preservation for a long period of time, and it is also superior in the light-resistance, heat-resistance, wet-resistance and the like. Since the master may be, so called, a usual silver salt photographic image itself, the information to be printed can be easily confirmed directly from the master and the master itself can be utilized to record information.

The electrostatic printing master of the present invention has wide uses and meets with many purposes, which is a feature of the master.

The invention will be understood more readily by reference to the following examples. However, these examples are intended to illustrate the invention and are not to be construed to limit the scope of the invention.

EXAMPLE 1

In a ball mill, 20 g. of silver behenate, 150 g. of methyl ethyl ketone and 150 g. of toluene were mixed, pulverized for 72 hours to prepare a uniform slurry. Then, 100 g. of a 20% solution of a polyvinyl butyral resin (S-Lec BM-1, a trade name for a product of Sekisui Kagaku K.K.) in ethyl alcohol was added to the slurry and gently mixed for about three hours. 0.12 G. of mercury acetate, 0.2 g. of calcium bromide and 5.0 g. of phthalazinone were successively added to the mixture. The resulting mixture was uniformly coated onto an aluminum plate having a thickness of 100 microns by a coating rod and dried at 80° C for 3 minutes.

The mixed solution of the following composition was coated onto the silver behenate layer formed as mentioned above.

| | |
|---|---|
| 2,2'-methylene-bis-6-t-butyl-p-cresol | 1.5 g. |
| Phthalazinone | 0.3 g. |
| Cellulose acetate (Daicel L-30, a trade name for a product of Daicel Ltd.), acetone 10 % solution | 10 g. |
| Acetone | 15 g. |
| Dye sensitizer | 0.005 g. |

$$\underset{C_2H_5}{\underset{|}{N}}\overset{S}{\underset{I}{\bigcirc}}C-CH=CH-CH=C\overset{S}{\underset{N}{\bigcirc}}\underset{C_2H_5}{|}$$

The above-mentioned operations were all conducted at a dark place.

The photosensitive plate thus prepared was exposed to a tungsten light source (60 lux) through a positive image for 2 seconds, and then a heating apparatus of a roller type was used to carry out the development so that a negative print was obtained by heating at 130° C for 2 seconds.

The above-mentioned photosensitive plate was uniformly subjected to corona discharging at −7 KV and immersed in a liquid developer containing a positively charged toner to obtain a positive toner image. A transfer paper was brought into contact with the toner image and the above-mentioned corona discharging was applied from the back side of the transfer paper to obtain a sharp visible image thus transferred. Such charging, developing and transferring steps were repeated. Even when the transferring of the image was repeated more than 1000 times, no deterioration was confirmed not only in the surface of the photosensitive plate, but also in the quality of the transferred image. As the result, this photosensitive plate bearing the negative visible image was confirmed to be excellent and useful as a master for repeat printing.

Further, it was confirmed that the silver image exhibited reproducibility with fidelity with respect to the original image, and therefore the corresponding electrostatic charge image was formed with complete fidelity, and further the toner image was a photographic image with fidelity.

EXAMPLE 2

The same procedure as that in Example 1 was repeated except that a polyester film (Mylar) having a thickness of 70 microns and being provided with an aluminum layer deposited thereon was used as a base in place of the aluminum plate. This aluminum-deposited base exhibits a flexibility sufficient to wind round a drum, and therefore, a great number of copies, that is, 1000 sheets of copy per one minute can be easily produced in such a manner that the master was wound round a rotary drum to effect recycle process comprising charging, toner developing (cascade developing), transferring and cleaning steps on the rotary drum as shown in FIG. 8. The obtained copies were easily readable and completely sharp. Also in this case, no deterioration in the master was found.

EXAMPLE 3

The same procedure as that in Example 1 was repeated except that a transparent polyester film was substituted for the transfer paper. The obtained image could be seen from the both sides thereof and seen by projection, and further reproduction of microfilm could be made.

| | |
|---|---|
| Equimolar mixture of silver behenate and behenic acid | 40 g. |
| Toluene | 150 g. |
| Acetone | 150 g. |

The above-mentioned ingredients were mixed and pulverized in a ball mill for 72 hours to prepare a uniform slurry. 200 G. of a 10% solution of a polyvinyl butyral resin in ethyl alcohol was gently added to the slurry and mixed for about three hours. Then, 0.06 g. of mercury acetate, 0.2 g. of calcium bromide and 5.0 g. of phthalazinone were successively added to the mixture. The resulting mixture was uniformly coated to a paper having been treated so as to be electrically conductive and dried.

| | |
|---|---|
| 2,6-di-t-butyl-p-cresol | 2.0 g. |
| Phthalazinone | 0.3 g. |
| Cellulose acetate (Daicel L-30, a trade name for a product of Daicel Ltd.), acetone 10 % solution | 10 g. |
| Acetone | 15 g. |
| Dye sensitizer; | 0.002 g. |
| Victoria Blue | 0.005 g. |

$$\underset{C_2H_5}{\underset{|}{N}}\overset{S}{\underset{I}{\bigcirc}}C-CH=CH-CH=C\overset{S}{\underset{N}{\bigcirc}}\underset{C_2H_5}{|}$$

The mixed solution of the above-mentioned composition was coated to the silver behenate layer formed in the foregoing manner to prepare a photosensitive member. The photosensitive member thus prepared was subjected to imagewise exposure and heat development to form a silver image so that a master was obtained. Positive corona charges were uniformly imparted to the master having the negative image to obtain an electrostatic latent image of the positive surface charges. A negative toner was given to the latent image by the magnet brush development and the transferring step was conducted in such a manner that corona charging was applied from the transfer paper side so that a sharp visible image free from fog was obtained. The obtained visible image was fixed by using a heater at 100° C. No deterioration in the quality of the transferred image was found even when the reproduction was repeated more than 1000 times.

EXAMPLE 5

A silver benztriazole sheet was prepared in the same manner as that in Example 4 except that silver benztriazole was used in place of the equimolar mixture of silver behenate and behenic acid.

| | |
|---|---|
| 2,2'-methyl-bis-6-t-butyl-p-cresol | 1.5 g. |
| Phthalimide | 0.5 g. |
| Cellulose acetate (Daicel L-30, a trade name for a product of Daicel Ltd.), acetone 10% solution | 10 g. |
| Acetone | 15 g. |
| Silica powder (Syloid #244, a trade name for a product of Fuji Davison K.K.) | 0.3 g. |

The mixed solution of the above-mentioned composition was coated onto the silver benztriazole layer to prepare a photosensitive sheet. A negative silver image was then formed on the photosensitive sheet in a usual manner, and subsequently, an electrostatic latent image was formed by negative corona discharging. After wet-type development of the latent image with a developer of a 0.1% aqueous solution of Malachite Green, the formed dye image was transferred to a transfer paper to obtain a sharp visible image.

EXAMPLE 6

| Liquid-A : | Water | 50 | ml. |
|---|---|---|---|
| | Gelatin | 2 | g. |
| | NaCl | 0.79 | g. |
| | KBr | 0.88 | g. |
| | CdCl$_2$ | 0.16 | g. |
| Liquid-B : | Distilled water | 20 | ml. |
| | AgNO$_3$ | 2.5 | g. |
| Liquid-C : | Water | 30 | ml. |
| | Gelatin | 8 | g. |

The above-mentioned Liquid B was added to Liquid A kept at 50° C and both liquids were allowed to react with each other at 50° C for 20 minutes, to which Liquid C were further added and the mixture was allowed to react at 50° C for 60 minutes, cooled to prepare a chloro bromide emulsion. The emulsion was warmed up to 40° C without washing with water, then coated to an aluminum plate having been completely subjected to degreasing and pear grain treatments and dried to obtain a photosensitive member.

The photosensitive member thus obtained was exposed through a positive original image in accordance with a usual manner, and Metol-Hydroquinone (MQ) developer of the following composition:

| Metol | 1 g. |
|---|---|
| Hydroquinone | 9 g. |
| Anhydrous sodium sulfite | 75 g. |
| Sodium carbonate | 30 g. |
| KBr | 5 g. | was used to carry out the development. The developed image was fixed with hypo, washed with water and dried to obtain a negative visible image.

The master prepared in the above-mentioned manner was further dried at 100° C for 10 minutes to remove the moisture contained in the gelatin, applying to the master a treatment for increasing the electric resistance of the non-image portion of the master.

Subsequently, negative corona discharging was uniformly applied to the surface of the master to form an electrostatic latent image. The latent image was developed with a positive liquid developer composed of fine particles and transferred to a transfer paper. The obtained toner image was a sharp positive visible image although its contrast was not so high.

EXAMPLE 7

A gelatin emulsion containing colloidal silver was prepared in a usual manner, coated to an aluminum plate having been subjected to complete degreasing and dried to form a positive-receiving layer.

The negative layer of the commercially available diffusion transfer material was exposed through a positive original image, and subsequently it was brought into contact with the above-mentioned positive-receiving layer and the development was carried out with a commercially available developer to obtain a positive visible image on the positive-receiving layer.

Further, the master having the positive-receiving layer was dried at 100° C for 15 minutes. A negative corona discharging was applied to the master and the formed latent image was developed with a negative liquid developer to form a toner image, which was then transferred to a transfer paper to obtain a positive visible image.

EXAMPLE 8

The resolution and tone-reproducibility of the transferred image obtained in the foregoing examples were examined to obtain the result shown below.

Table 1

| Example | Resolution of toner image formed on transfer material | **Step wedge of toner image formed on transfer material | Development |
|---|---|---|---|
| 1 | 8 lines/mm | 8 | Liquid development |
| 2 | 8 lines/mm | 8 | Liquid Development |
| 3 | *60 lines/mm | 10 | Liquid Development |
| 4 | 6 lines/mm | 7 | Magnet brush development |
| 5 | 4 lines/mm | 5 | Wetting development |
| 6 | 8 lines/mm | 10 | Liquid development |
| 7 | 6 lines/mm | 8 | Liquid Development |

*A test sheet for microfilm was placed in contact with the master under vacuum to effect exposure.
**Printing was effected through a usual step wedge having a density difference of 0.2.

EXAMPLE 9

A master having a negative print was prepared in the same manner as that in Example 1. The master was uniformly subjected to corona discharging at −7 KV and immersed in a liquid developer containing a positively charged toner to obtain a positive toner image. A transfer paper was placed into contact with the toner image and the above-mentioned corona discharging was applied from the transfer paper side to obtain a sharp visible image as transferred. On the other hand, immediately after completion of the above-mentioned transferring step, the negative visible image on the master was again utilized and directly toner-developed without further application of corona discharging to transfer the toner image to other transferring paper so that a sharp visible image as transferred was obtained. In this case, since corona discharging was effected simultaneously at the time of the transferring step of the first process, that is, the charging transfer method was effected, the charging step of the second process was omitted. Owing to effective utilization of the corona discharging upon the transferring, it was possible to shorten the process comprising recycle of charging-developing-transferring steps to the process comprising recycle of developing-transferring steps in which the charging step was omitted. Even when the transferring of the image was repeated more than 1000 times, any deterioration in the image was not found although the contrast of the image obtained by the shortened process was apt to reduce to some extent as compared with that of the image obtained by the process of the charging-developing-transferring steps.

EXAMPLE 10

The same procedure as in Example 1 was repeated to prepare a master except that a polyester film (Mylar)

having a thickness of 30 microns was used as the base in place of the aluminum plate.

Double corona discharging of +3.5 V and −3.5 V was applied to the master from the both sides thereof so that an electrostatic image was formed due to the difference in the electrostatic capacity between the exposed portion and the unexposed portion as shown in FIG. 9. The master was immersed in a liquid developer containing a negatively charged toner to obtain a positive toner image on the both sides thereof. The toner image on the base side of the master was repeatedly transferred to a transfer paper to obtain a sharp visible image. No mechanical damage was observed on the master even when it was repeated for use more than 1000 times since Mylar, the base of the master exhibited a high mechanical strength.

EXAMPLE 11

A master was prepared in the same manner as that in Example 1 except that an aluminum plate having been provided with an insulating layer of epoxy resin having a thickness of about 3 microns was substituted for the aluminum plate.

The master was subjected to corona discharging at +7 KV as shown in FIG. 10 to form an electrostatic charges image thereon due to the difference in the electrostatic capacity. The electrostatic image was then developed with a liquid developer containing a negatively charged toner to obtain a positive toner image.

The transferred toner image of a higher contrast was obtained as compared with the case of Example 1. No difference in the repetition characteristic between the master prepared in Example 1 and that in this example was found.

EXAMPLE 12

A polyester film having a thickness of about 5 microns was superposed on the master prepared in Example 1 and corona discharging of +7 KV was applied thereto so that an electrostatic latent image of a higher contrast was formed on the silver image portion due to the difference in the electrostatic capacity. The latent image was developed with a liquid developer containing a positively charged toner to obtain a positive toner image. The above-mentioned procedure was found to be effective to improve the repetition characteristic of the master.

EXAMPLE 13

Photosensitive members 1 - 34 were prepared by using various organic silver salt compounds, insulating media and halides, and they were subjected to imagewise exposure and heat development to obtain masters for electrostatic printing. The same treatments as those in Example 1 were applied to the masters to obtain transferred images, the result of which was as shown in Tables 2 and 3.

Table 2

| Photosensitive member | Photosensitive layer-forming material | | | Quality of transferred image |
|---|---|---|---|---|---|
| | Organic silver salt | Insulating medium | Halide | Base | |
| | | (% by weight based on organic silver salt) | | | |
| 1 | Silver behenate | Polymethyl methacrylate (120) | Potassium bromide (1.1) | B | Δ |
| 2 | " | Polystyrene (120) | " (") | B | Δ |
| 3 | " | Polyester (120) | " (") | B | ⊚ |
| 4 | " | Styrene-butadiene copolymer (120) | " (") | B | ○ |
| 5 | " | Polyvinyl acetate (120) | " (") | B | ⊚ |
| 6 | " | Polyurethane (120) | " (") | B | ○ |
| 7 | " | Epoxy resin (120) | " (") | B | ○ |
| 8 | Silver stearate | Polyvinyl butyral (80) | Ammonium iodide (2) | D | ○ |
| 9 | Silver oleate | " (") | " (") | D | ○ |
| 10 | Silver palmitate | " (") | " (") | D | ⊚ |
| 11 | Silver myristate | " (") | " (") | D | ○ |
| 12 | Silver laurate | " (") | " (") | D | ○ |
| 13 | Silver caprate | " (") | " (") | D | ○ |
| 14 | Silver p-toluenesulfonate | " (") | " (") | D | Δ |
| 15 | Silver 2-aminoethane sulfonate | " (") | " (") | D | ○ |
| 16 | Silver benzoate | " (") | " (") | D | ○ |

Table 3

| Photosensitive member | Photosensitive layer-forming material | | | | Quality of transferred image |
|---|---|---|---|---|---|---|
| | Organic silver salt Organic acid | (wt. %) (wt. %) | Insulating medium (wt. % based on organic silver salt plus organic acid) | Halide | Base | |
| 17 | Silver behenate Behenic acid | (28) (72) | Polyvinyl butyral (28) | Mercury bromide (0.8) | A | ○ |
| 18 | Silver behenate Behenic acid | (51) (49) | " (51) | " (") | A | ⊚ |
| 19 | Silver behenate Behenic acid | (78) (22) | " (78) | " (") | A | ○ |
| 20 | Silver behenate | (92) | " | " | A | ○ |

Table 3-continued

| Photosensitive member | Photosensitive layer-forming material | | | | Base | Quality of transferred image |
|---|---|---|---|---|---|---|
| | Organic silver salt / Organic acid | Insulating medium (wt. %) | Halide (wt. % based on organic silver salt plus organic acid) | | | |
| | (wt. %) | | | | | |
| 21 | Silver behenate (51) / Behenic acid (49) | Behenic acid (8) | (92) (10) | (") Calcium bromide (0.5) Gold chloride (0.5) | C | Δ |
| 22 | " / " | (") (") | " (20) | (") (") | C | O |
| 23 | " / " | (") (") | " (40) | (") (") | C | ◎ |
| 24 | "(") / " | " (") | " (75) | (") C (") | | ◎ |
| 25 | " / " | (") (") | " (100) | (") (") | C | ◎ |
| 26 | " / " | (") (") | " (300) | (") (") | C | O |
| 27 | " / " | (") (") | " (500) | (") (") | C | Δ |
| 28 | " / " | (78) (22) | " (60) | (") Lithium bromide (10) | A | O |
| 29 | " / " | (") (") | (") | (5) | A | ◎ |
| 30 | " / " | (") (") | (") | (1) | A | ◎ |
| 31 | " / " | (") (") | (") | (0.5) | A | ◎ |
| 32 | " / " | (") (") | (") | (0.1) | A | O |
| 33 | " / " | (") (") | (") | (0.01) | A | O |
| 34 | " / " | (") (") | (") | (0.001) | A | Δ |

Note:
A Art paper
B Electroconductive paper
C Aluminum sheet
D Synthesized resin sheet having a deposited aluminum layer on its surface
◎ Extremely good
O Good
Δ Practically acceptable The sensitizing agent used in the preparation of the photosensitive members is the same as that used in Example 1, and the reducing agents are as follows.

Nos. 1 – 7: 4,4'-thiobis (6-t-butyl-3-methylphenol) was coated along with polyvinyl butyral onto the layer containing the organic silver salt compound (silver behenate).

Nos. 8 – 11: 10% by weight of 1,1'-bi-2-naphthol based on the organic silver salt compound (silver behenate) was incorporated into the layer containing the organic silver salt compound.

Nos. 12 – 18: 8% by weight of octadecyl 3-(3',5'-di-t-butyl-4'-hydroxyphenyl) propionate based on the organic silver salt compound was incorporated into the layer containing the organic silver salt compound.

Nos. 19 – 27: 4,4'-butylidene bis (6-t-butyl-3-methylphenol) was coated along with cellulose acetate onto the layer containing the organic silver salt compound in accordance with Example 1.

Nos. 28 – 34: Phenidone was coated along with vinyl acetate onto the layer containing the organic silver salt compound.

We claim:

1. A process for electrostatic printing comprising the steps of:

A. providing a member having an insulating photosensitive layer including an organic silver salt compound, a reducing agent and an insulating medium, wherein said member, when treated by a process including exposure to image light from an original, provides in the layer a conductive metallic silver grain image corresponding to said image light,
    B. employing said treated member as a master by forming an electrostatic latent image thereon,
    C. developing said image and
    D. transferring said developed image to a transfer material, whereby the durability of said master and the resolution of said developed image are unexpectedly enhanced.

2. The process of claim 1 including repeating steps B, C, and D.

3. The process of claim 1 including repeating steps C and D.

4. The process of claim 1 in which at least two of said masters are simultaneously employed in sequence in steps B, C and D.

5. The process of claim 1 in which at least two of said masters are simultaneously employed in sequence in steps C and D.

6. The process of claim 1 including the step of transferring said developed image to a transfer material by a charging transfer, whereby the developed image is rapidly and efficiently transferred to the transfer material, the surface of the master is charged for forming an electrostatic latent image and the durability of the master and the resolution of the developed image are unexpectedly enhanced.

7. The process of claim 1 including the steps of transferring said developed image to a transfer material by a charging transfer to expedite image transfer and to charge the surface of said master and thereafter, applying a supplementary charge to the surface of the master to reinforce the charge applied during the charging transfer, whereby the durability of said master and the resolution of said developed image are unexpectedly enhanced.

8. The process of claim 6 including repeating said charging transfer step and said developing step to provide a plurality of copies from said original.

9. The process of claim 7 including repeating said charging transfer step, said supplementary charge application and said developing step to provide a plurality of copies from said original.

10. The process of claim 4 including repeating steps B, C and D.

11. The process of claim 5 including repeating steps C and D.

12. The process of claim 1 wherein said conductive metallic silver grain image is formed by heat developing with or after said exposure to image light.

13. A process for electrostatic printing comprising the steps of:
   A. providing a member having an insulating photosensitive layer formed by dispersing a silver salt compound in an insulating medium, wherein said member, when treated by a process including exposure to image light from the original, provides in the layer a conductive metallic silver grain image corresponding to said image light, said silver grain image having a specific resistance $\rho_1$ less than $10^{13}$ ohm·cm, the remaining portion of said layer having a specific resistance $\rho_2$ more than $10^{11}$ ohm·cm, and $\rho_1$ is less than $\rho_2$ by a factor of two powers of ten or more;
   B. employing said treated member as a master by forming an electrostatic latent image thereon,
   C. developing said image and
   D. transferring said developed image to a transfer material, whereby the durability of said master and the resolution of said developed image are unexpectedly enhanced.

14. The process of claim 13 including repeating steps B, C and D.

15. The process of claim 13, including repeating steps C and D.

16. The process of claim 13, in which at least two of said masters are simultaneously employed in sequence in steps C and D.

17. The process of claim 13 in which at least two of said masters are simultaneously employed in sequence in steps B, C and D.

18. The process of claim 13 including the step of transferring said developed image to a transfer material by a charging transfer, whereby the developed image is rapidly and efficiently transferred to the transfer material, the surface of the master is charged for forming an electrostatic latent image and the durability of the master and the resolution of the developed image are unexpectedly enhanced.

19. The process of claim 18 including repeating said charging transfer step and said developing step for producing a plurality of copies from said original.

20. The process of claim 13 including the step of transferring said developed image to a transfer material by a charging transfer to expedite image transfer and to charge the surface of said master and thereafter applying a supplementary charge to the surface of the master to reinforce the charge applied during the charging transfer, whereby the durability of said master and the resolution of said developed image are unexpectedly enhanced.

21. The process of claim 20 including repeating said charging transfer step, said supplementary charge application step, and said developing step to provide a plurality of copies from said original.

22. The process of claim 16 including repeating steps C and D.

23. The process of claim 17 including repeating steps B, C and D.

24. The process of claim 13 wherein said conductive metallic silver grain image is formed by heat developing with or after said exposure to image light.

25. A process for electrostatic printing comprising the steps of:
   A. image wise exposing a heat developable photosensitive member having a layer formed by dispersing uniformly a silver salt compound in a insulating medium to form a latent image including metallic silver particles;
   B. heating with or after said image wise exposure to develop said latent image and form a conductive metallic silver grain image,
   C. employing said developed member as a master by forming an electrostatic latent image thereon,
   D. developing said image and
   E. transferring said developed image to a transfer material, whereby the durability of said master and the resolution of said developed image are unexpectedly enhanced.

26. The process of claim 25 including repeating steps C, D and E.

27. The process of claim 25, including repeating steps D and E.

28. The process of claim 25 in which at least two of said masters are simultaneously employed in sequence in steps C, D and E.

29. The process of claim 25 in which at least two of said masters are simultaneously employed in sequence in the steps D and E.

30. The process of claim 28 including repeating steps C, D and E.

31. The process of claim 29 including repeating steps D and E.

32. The process of claim 25 including the step of transferring said developed image to a transfer material by a charging transfer, whereby the developed iamge is rapidly and efficiently transferred to the charging material, the surface of the master is charged for forming an electrostatic latent image and the durability of the master and the resolution of the developed image are unexpectedly enhanced.

33. The process of claim 32 including repeating said charging transfer step and said developing step to provide a plurality of copies of said original.

34. The process of claim 25 including the step of transferring said developed image to a transfer material by a charging transfer to expedite image transfer and to charge the surface of said master and thereafter applying a supplementary charge to the surface of the master to reinforce the charge applied during the charging transfer, whereby the durability of said master and the resolution of said developed image are unexpectedly enhanced.

35. The process of claim 34 including repeating the charging transfer step, the supplementary charge application step and the developing step to provide a plurality of copies from said original.

* * * * *

UNITED STATES PATENT AND TRADEMARK OFFICE
CERTIFICATE OF CORRECTION

PATENT NO. : 4,069,759
DATED : January 24, 1978
INVENTOR(S) : ICHIRO ENDO ET AL.

It is certified that error appears in the above-identified patent and that said Letters Patent are hereby corrected as shown below:

Column 9, line 30, change "other" to --another--;

Column 10, line 24, change "side" to --sides--;

Column 12, line 5, insert --Example 4--;

Column 15, line 26, change "charges" to --charge--;

Column 17, line 15, in Table 3, under Heading "Organic silver salt, Organic acid, Behenic acid, Silver behenate, Behenic acid", delete "(")" second column;

Column 19, line 38, in Claim 13, after "from the original" insert --and heating--.

*Signed and Sealed this*

*Fourth* Day of *July 1978*

[SEAL]

Attest:

RUTH C. MASON
*Attesting Officer*

DONALD W. BANNER
*Commissioner of Patents and Trademarks*